US011158486B2

(12) United States Patent
Sun et al.

(10) Patent No.: US 11,158,486 B2
(45) Date of Patent: Oct. 26, 2021

(54) METHOD FOR SEM-GUIDED AFM SCAN WITH DYNAMICALLY VARIED SCAN SPEED

(71) Applicant: JIANGSU JITRI MICRO-NANO AUTOMATION INSTITUTE CO., LTD., Suzhou (CN)

(72) Inventors: Yu Sun, Toronto (CA); Jun Chen, Suzhou (CN); Ko Lun Chen, Toronto (CA); Tiancong Wang, Suzhou (CN)

(73) Assignee: JIANGSU JITRI MICRO-NANO AUTOMATION INSTITUTE CO., LTD., Suzhou (CN)

(*) Notice: Subject to any disclaimer, the term of this patent is extended or adjusted under 35 U.S.C. 154(b) by 0 days.

(21) Appl. No.: 17/252,837

(22) PCT Filed: Jun. 29, 2018

(86) PCT No.: PCT/CN2018/093761
§ 371 (c)(1),
(2) Date: Dec. 16, 2020

(87) PCT Pub. No.: WO2020/000400
PCT Pub. Date: Jan. 2, 2020

(65) Prior Publication Data
US 2021/0125809 A1   Apr. 29, 2021

(51) Int. Cl.
*G01Q 30/02*   (2010.01)
*G01Q 30/04*   (2010.01)
(Continued)

(52) U.S. Cl.
CPC ............. *H01J 37/28* (2013.01); *G01Q 10/06* (2013.01); *G01Q 30/02* (2013.01); *G01Q 30/04* (2013.01);
(Continued)

(58) Field of Classification Search
CPC ............. H01J 37/28; H01J 2237/2583; H01J 2237/2814; G01Q 10/06; G01Q 30/02; G01Q 30/04; G01Q 60/30
(Continued)

(56) References Cited

U.S. PATENT DOCUMENTS

| 7,461,543 | B2 | 12/2008 | Degertekin | |
| 7,464,583 | B1* | 12/2008 | Kowalewski | G01Q 30/04 73/105 |
| 2015/0160260 | A1* | 6/2015 | Gabi | G01Q 30/04 850/10 |

FOREIGN PATENT DOCUMENTS

| CN | 101855534 A | 10/2010 |
| CN | 103900504 A | 7/2014 |

(Continued)

Primary Examiner — Nicole M Ippolito
(74) Attorney, Agent, or Firm — SZDC Law PC

(57) ABSTRACT

A method discloses topography information extracted from scanning electron microscope (SEM) images to determine the atomic force microscope (AFM) image scanning speed at each sampling point or in each region on a sample. The method includes the processing of SEM images to extract possible topography features and create a feature metric map (step 1), the conversion of the feature metric map into AFM scan speed map (step 2), and performing AFM scan according to the scan speed map (step 3). The method enables AFM scan with higher scan speeds in areas with less topography feature, and lower scan speeds in areas that are rich in topography features.

13 Claims, 7 Drawing Sheets

(51) Int. Cl.
*H01J 37/28* (2006.01)
*G01Q 10/06* (2010.01)
*G01Q 60/30* (2010.01)

(52) U.S. Cl.
CPC ...... *G01Q 60/30* (2013.01); *H01J 2237/2583* (2013.01); *H01J 2237/2814* (2013.01)

(58) Field of Classification Search
USPC .................................. 850/1, 2, 3, 4, 8, 9, 33
See application file for complete search history.

(56) References Cited

FOREIGN PATENT DOCUMENTS

| | | | |
|---|---|---|---|
| CN | 10484999 | A | 8/2015 |
| CN | 107727886 | A | 2/2018 |
| JP | 2013145120 | A | 7/2013 |

\* cited by examiner

METHOD FOR SEM-GUIDED AFM SCAN WITH DYNAMICALLY VARIED SCAN SPEED

This application is the National Stage Application of PCT/CN2018/093761, filed on Jun. 29, 2018.

BACKGROUND OF THE INVENTION

Scanning electron microscopy (SEM) and scanning probe microscopy (SPM) are platforms for nanometer and sub-nanometer imaging. SPM, such as atomic force microscopy (AFM), scans across the surface of a sample using a sharp cantilever tip via closed-loop position and force control to obtain 3D topography of the sample. Different from SPM, SEM produces images of a sample by scanning the surface with a focused beam of electrons. The electrons interact with atoms in the sample, producing signals that contain information about the sample's surface topography (mostly 2D) and composition.

Based on different physical principles for imaging, SPM and SEM represent two complementary imaging techniques. Since they are typically large-sized, incompatible instruments, a sample is often imaged by SEM and SPM separately and the images are correlated to gain more comprehensive information of the sample. However, transferring a sample back and forth between SPM and SEM instruments and relocating the same region of interest (ROI) on the sample is a laborious and challenging task. This limitation can be elegantly overcome by installing a small-sized SPM inside the vacuum chamber of an SEM, which is described in U.S. Pat. Nos. 5,081,353, 5,229,607, 5,256,876 and U. Mick el al. (IEEE ICRA, pp. 4088-4093, 2010) (i.e., hybrid SEM-SPM system). This hybrid approach provides powerful capabilities (e.g., in situ SPM-SEM complementary imaging, fast sample navigation down to nanometer scale, in situ nanoindentation, SPM tip monitoring during measurement, and visually guided nanomanipulation), which cannot be achieved in standalone systems.

While SEM can achieve a frame rate as high as 20 Hz, SPMs often take minutes to generate an image. The low bandwidth of SPM imaging is intrinsically limited by the mechanical response of SPM cantilever and piezo scanners. Thus, in hybrid SEM-SPM imaging, the low efficiency of SPM imaging is the bottleneck. Simply setting a high SPM scan speed can lead to sacrificed imaging accuracy and potential damage of the SPM cantilever tip and sample. During SPM scan, surface topography variations of the sample cause changes of the tip-sample distance. The SPM controller requires a certain settling time to reach the steady state. When the XY piezo scanners move at too high a speed, the SPM controller is not able to reach a steady state for each sampling point on the sample. For instance, at a steep falling edge on the sample, the SPM tip may completely lose track of the sample topography (also called parachuting), leading to loss of sample information and large errors in topography imaging. At a steep rising edge of the sample, the SPM tip may crash into the sample, leading to SPM tip and sample damage. Thus, a trade-off exists between SPM scan speed and imaging accuracy.

In practice, samples contain topography features in certain regions while many other regions have minimal or no topography features. Therefore, there is no need to use a constant speed to scan both the feature-containing and feature-lacking areas. Several strategies have been proposed aiming to increase the scanning efficiency. U.S. Pat. No. 5,204,531 and J.-W. Wu et al. (IEEE Trans. Nanotechnology, Vol. 14, pp. 810-819, 2015) discloses a method of performing a fast AFM coarse scan to identify regions that contain features, followed by a slow AFM scan of the feature-containing areas to obtain high resolution images. Similarly, bi-direction scan was disclosed in U.S. Pat. No. 9,645,169 and Y. Wu et al. (IEEE 3M-NANO, pp. 171-176, 2014), in which a fast AFM forward scan is used to guide the slow AFM backward scan. X. Ren et al. (IEEE 3M-NANO, pp. 245-250, 2015) performed a complete AFM scan of ROI at a high speed to obtain approximate topography information, followed by scanning the same ROI again at varied scan speed to collect more detail in feature-rich regions. All these existing methods share the commonality of utilizing fast SPM scan to gain coarse topography information of the sample, followed by slow SPM scan to capture the fine details. Due to the serial nature of SPM scanning, these techniques do not result in significant scan time reduction. The use of fast scan to obtain preliminary topography information also risks damaging the SPM tip from sample collision.

Since many SPM systems operating in the ambient environment are installed on an optical microscope, limited topography information of the sample can be obtained through optical microscope imaging. In U.S. Pat. Nos. 7,430,898, 5,426,302 and C.-L. Chen et al. (IEEE/ASME Trans. Mechatronics, Vol. 20, pp. 226-236, 2015), under the visual guidance of optical microscopy imaging, the human operator manually identifies and selects areas that contain topography features. Then the AFM scans the selected area at a high resolution while skipping all other areas. A similar technique was described in U.S. Pat. No. 9,366,693, but the entire field of view is scanned by AFM, with more data points collected at manually selected regions to capture finer topography details. The low-resolution of optical microscopy imaging limits the effectiveness of these approaches.

What is needed is a method of using high-speed nanoscale imaging to identify topography features on a sample and utilizing the topography information to vary the SPM (or AFM) scan speed in different regions of the sample. The present invention discloses a method that uses the high-speed, high-resolution imaging capability of SEM to identify topography features, and uses the topography information to guide the scan speed of SPM accordingly.

SUMMARY OF THE INVENTION

Atomic force microscopy (AFM) is an intrinsically slow imaging technique that utilizes a force sensing sharp probe to raster scan the sample surface at a constant speed to obtain three-dimensional topography information. In practice, sample contains topography features in certain regions while many other regions have minimal or no topography features. Using a constant speed to scan both the feature containing and feature lacking area is highly inefficient. To improve AFM scan efficiency requires: (1) a high resolution, high speed method to determine the approximate topography of the sample surface; (2) to utilize the topography information to guide the scan speed of the AFM to improve imaging efficiency.

In one embodiment of the present invention, it provides for a method that uses the high-speed, high-resolution imaging capability of SEM to identify topography features, and uses the topography information to guide the scan speed of AFM accordingly. The steps include: (1) generating the feature metric map using image processing algorithms capable of extracting topography information from SEM images; (2) generating the AFM scan speed map using the feature metric map; (3) performing the AFM scan according to the scan speed map, to use a high scan speed for locations on the sample with minimal topography feature, and use a low scan speed for locations on the sample with rich topography features.

DETAILED DESCRIPTION OF THE EMBODIMENTS

AFM provides accurate three-dimensional topography scan, but the serial scanning nature of the technique limits its imaging speed. SEM performs two dimensional imaging in real time (e.g., 10 frames per second) with nanometer resolutions, but it lacks accurate depth sensing capability. Merging the two microscopy methods together can provide efficient 3D topography imaging.

Embodiments of the present invention described herein address this problem by providing a method for improving the AFM scanning efficiency with the information extracted from SEM images.

The SEM produces images of a sample by scanning the surface with a focused beam of electrons. The electrons interact with atoms in the sample, producing various signals, one of which is secondary electrons (SE). The electron beam is scanned in a raster scan pattern, and the number of SE collected by the SE detector at each beam's position determines the SEM image brightness at each pixel. SEM image formed by SE provides qualitative information about the topography of a sample. For example, a surface facing the SE detector will appear brighter, since it is easier for SE to get collected by the SE detector. Edges of an object will also appear brighter, since more SE are generated at the edges. Based on these properties of SEM image, it is feasible to extract approximate topography information about a sample from SEM images.

AFM forms images by using a force sensing probe tip to scan a sample surface to determine properties such as 3D topography. Limited by the mechanical resonant frequency of the AFM piezoelectric scanners and the AFM cantilever, the scan speed of AFM is typically 1 line per second. An AFM image with 256 line scans can take—4 minutes to complete. A faster scan speed lowers imaging accuracy and increases the risk of damaging the cantilever tip from colliding with the sample during fast scan.

This invention describes methods to extract topography information from SEM's SE images through image processing, and utilize the information to vary the scan speed of the AFM dynamically to achieve higher AFM scan speed with little or no degradation in scan accuracy. In areas identified to have rapid changes in topography, the AFM scan speed is adaptively set to a lower value to avoid the AFM cantilever tip from colliding with the sample, and to gather more measurement data to capture the fine details. In areas identified to have minimal topography change (e.g., flat surface), the AFM scan speed is adaptively set to a higher value to reduce the overall image scan time. Different from existing methods that utilize either optical imaging or SPM imaging to obtain approximate/preliminary topography information, SEM imaging has significantly higher imaging resolution (nanometer) in real-time (10-15 frames per second), significantly reducing the time needed for obtaining approximate topography information about the sample.

System Setup

Figure 1:
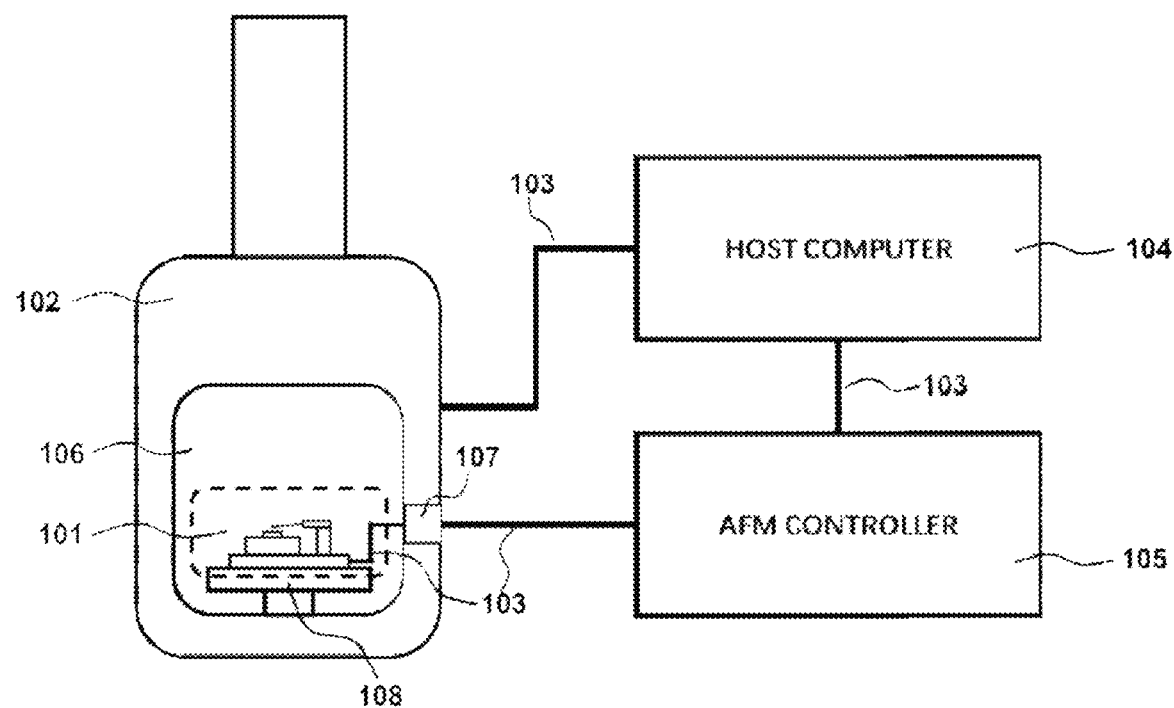
FIG. 1 illustrates the system design of SEM-guided AFM.

In one embodiment of the present invention, the SEM compatible AFM system consists of four major components (FIG. 1). The AFM carrier 101 is mounted on the SEM specimen stage 108 inside the chamber 106 of SEM 102. The SEM 102 generates an SEM image of the sample, and the image is transmitted to the host computer 104 via a transmission medium 103. The host computer 104 processes the extracted SEM image through algorithms (see Methods section below) to extract topography information of the sample and generate a map termed feature metric map. The feature metric map is then converted to the AFM scan speed map (see Methods section below). The feedthrough flange 107 allows the transmission medium 103 to pass the wall of SEM chamber 106 to link the AFM controller 105 and the AFM carrier 101 together. The AFM controller 105 sends control signals to the AFM 102 on the AFM carrier 101 to control the AFM scan speed at each point on the sample based on the scan speed map stored in the AFM controller 105.

Figure 2:
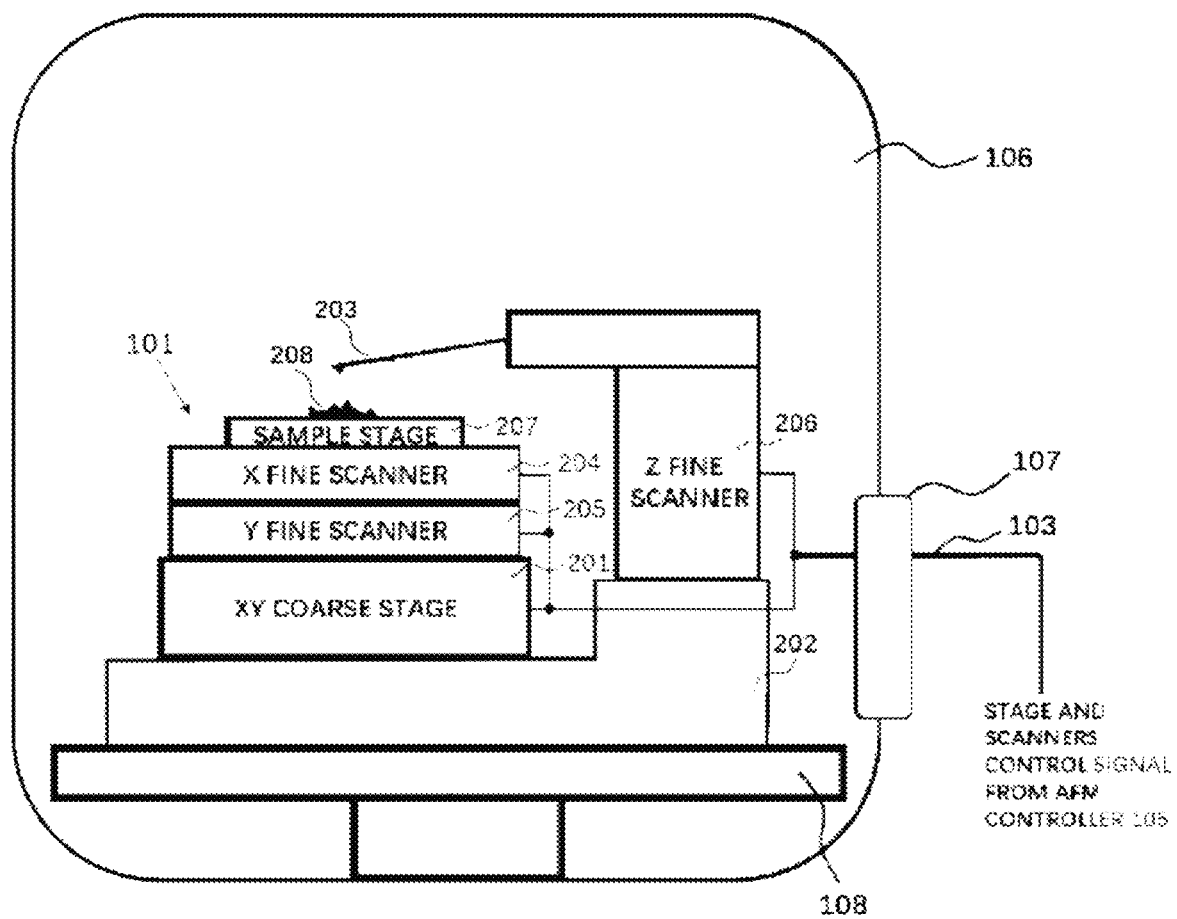
FIG. 2 is a schematic diagram illustrating a detailed configuration of atomic force microscopy (AFM) carrier mounted inside the scanning electron microscopy (SEM) chamber.

The AFM carrier 101 is placed inside the vacuum chamber 106 of the SEM 102. FIG. 2 illustrates details of AFM carrier 101. The X-Y coarse stage 201 is mounted on the base plate 202 to provide coarse positioning for aligning AFM cantilever tip to the sample 208. The X and Y fine scanners 204, 205, usually made by piezo ceramic materials, are placed on the top of XY coarse stage 201 to provide high speed (up to kHz) XY raster scan. The AFM cantilever 203 is mounted on the Z scanner 206 and positioned above the AFM sample stage 207.

The AFM controller 105 is configured to drive the XY-fine scanner 204, 205, Z scanner 206 and XY coarse stage 201. The scanning wave generator uses the speed map stored in the controller memory to generate the scanner driving signals.

Methods

Figure 3:
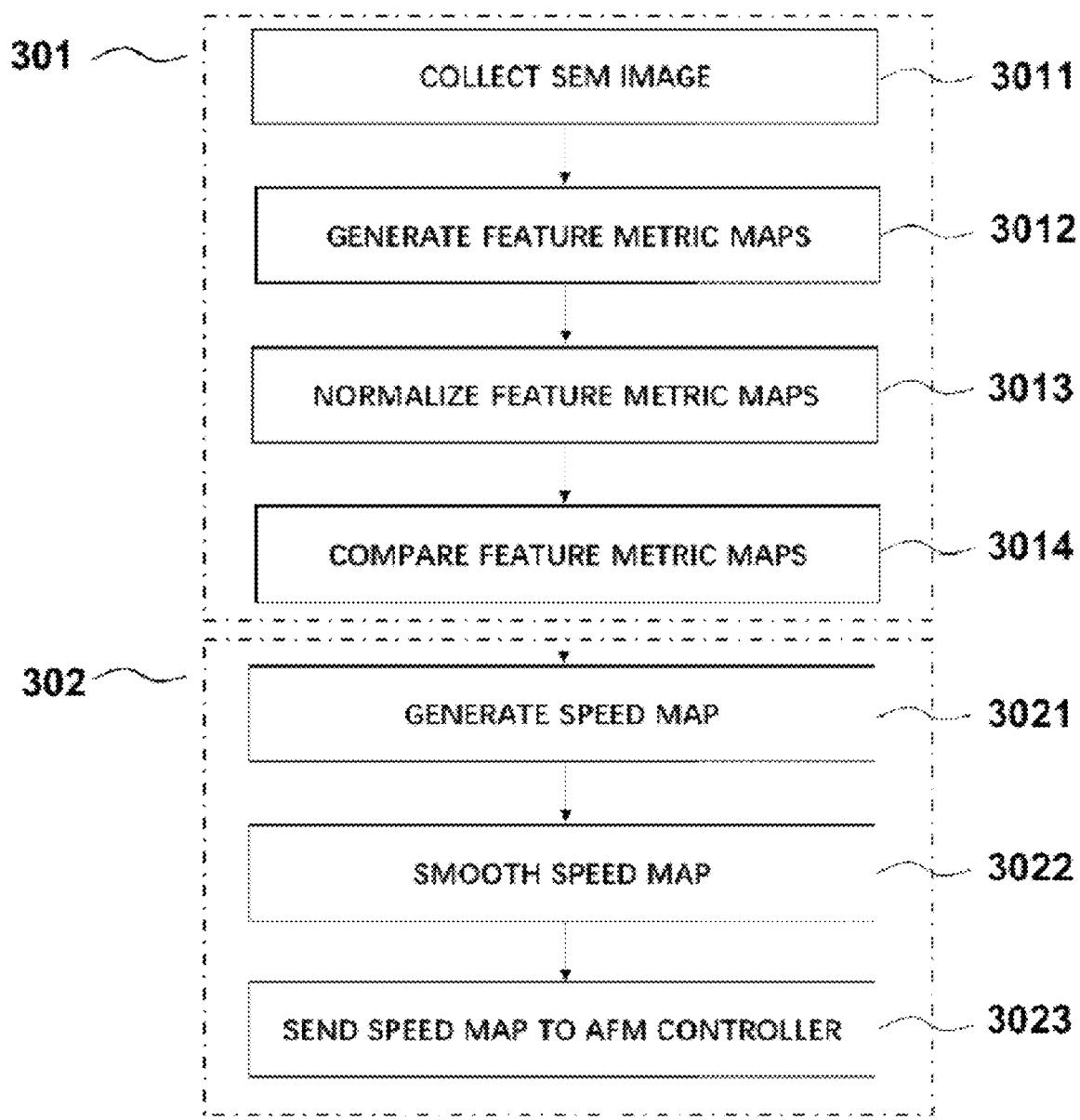
FIG. 3 is a flowchart illustrating a method of generating the feature metric map and converting it to the scan speed map.

The main steps of the present invention are illustrated in FIG. 3. The invention consists of two main steps: (301) Extract the topography information from the SEM image of the sample to generate the feature metrics map; (302) Use the feature metric map to generate the AFM scan speed map, and execute the AFM scan according to the speed map.

Step 1: Generate Feature Metric Map

The goal of the first main step 301 is to generate the feature metric map of the sample. The feature metric map quantitatively shows those areas within the sample that contain topography features. Detailed steps include collecting the SEM image 3011; using algorithms to extract topography features 3012; normalizing the topography feature results 3013; comparing the normalized results from different algorithms and determining optimal feature metric map 3014.

In the first step 3011, the operator selects the region of interest (ROI) from the real-time captured SEM image. The image of the ROI is then sent to the host computer to quantify the amount of topography features within the SEM image. In the step of 3012, secondary electron (SE) imaging mode of SEM is used because it provides the best representation of sample topography compared to other imaging modes such as back scattered electron (BSE) and cathode luminescence (CL). In the SE imaging mode, the gray scale level of each pixel is determined by the number of SEs generated when the focused electron beam interacts with the sample surface. The more SEs are generated, the brighter the corresponding pixel in the SEM image is. On a flat surface, the amount of SEs collected by the detector is consistent, which leads to a uniform grey scale level region in the SEM image. At the edges of a feature, more SEs are collected from the sample surface, resulting in a bright outline of the feature.

Utilizing these properties of SEM images, rapidly changing topography features appear in the SEM image as rapidly changing gray scale pixels. This invention uses algorithms (see below) to detect rapidly changing gray scale pixel to identify topography features within the SEM image, and generates a quantitative feature metric map. The values of the metric are correlated to the amount of local information in the SEM image. The metrics should be able to quantitatively describe the amount of local features and distinguish the feature-containing and feature-lacking regions in SEM images. In this embodiment, four different algorithms are described that were experimentally found effective in identifying rapidly changing grey scale levels within SEM images. The use of other algorithms beyond the example algorithms below, which can produce similar resulting effects, are also covered within the scope of this invention.

In one embodiment of present invention, four different algorithms are used to identify rapidly changing gray scale levels within SEM images as below.

1) Local entropy quantifies the statistical histogram uniformity of a local region in an image. The edges on the sample surface lead to brighter features compared to the flat region, resulting in non-uniformity in the neighborhood (C. Yan et al., Pattern Recognition Letters, Vol. 24, pp. 2935-2941, 2003);

2) Local standard deviation (STD) represents the statistical degree of variability of pixel values in a local region. Edge features in an SEM image tend to exhibit higher variability than at regions (D.-C. Chang et al., IEEE Trans. Medical Imaging, Vol. 17, pp. 518-531, 1998);

3) Local range of gray level (RofGL) is the difference between the maximum and minimum gray level in a neighborhood. For an edge and a at region in an SEM image, local RofGL reveals the changes in the range of pixel values in the neighbourhood (R. Gonzalez et al., Digital Image Processing, 4th ed., Chapter. 9, Pearson/Prentice Hall, 2006);

4) Local magnitude of gradient (MofG) evaluates the degree of slope in a neighborhood of an image. Steeper feature edges on the sample surface lead to larger slopes in an SEM image than after sample regions. Other algorithms are also usable (W. Xue et al., IEEE Trans. Image Processing, Vol. 23, pp. 4850-4862, 2014).

The feature metric map extracted from step 3012 is normalized into the range between 0 to 1 (3013). Normalization allows the feature metric maps generated by the different algorithms to be directly compared. To quantify how well each algorithm distinguishes regions with and without topography features on the sample, a differentiation index (DI) is defined as: $DI=M_c/M_l$, where $M_c$ is the mean metric value in feature-containing regions, and $M_l$ is the mean metric value in feature-lacking regions. A larger value of DI indicates that the topography information of features in an SEM image is better captured. The case of DI approaching 1 indicates that the metric is not effective in capturing the information of features in an SEM image.

In this embodiment, the four algorithms each have different advantages under different SEM imaging conditions (image magnification, electron beam energy, spot size, and sample material properties). To identify the most suitable algorithm to use for a specific sample, the system automatically computes the DI value of each feature metric map and compares them (3014).

Figure 4:
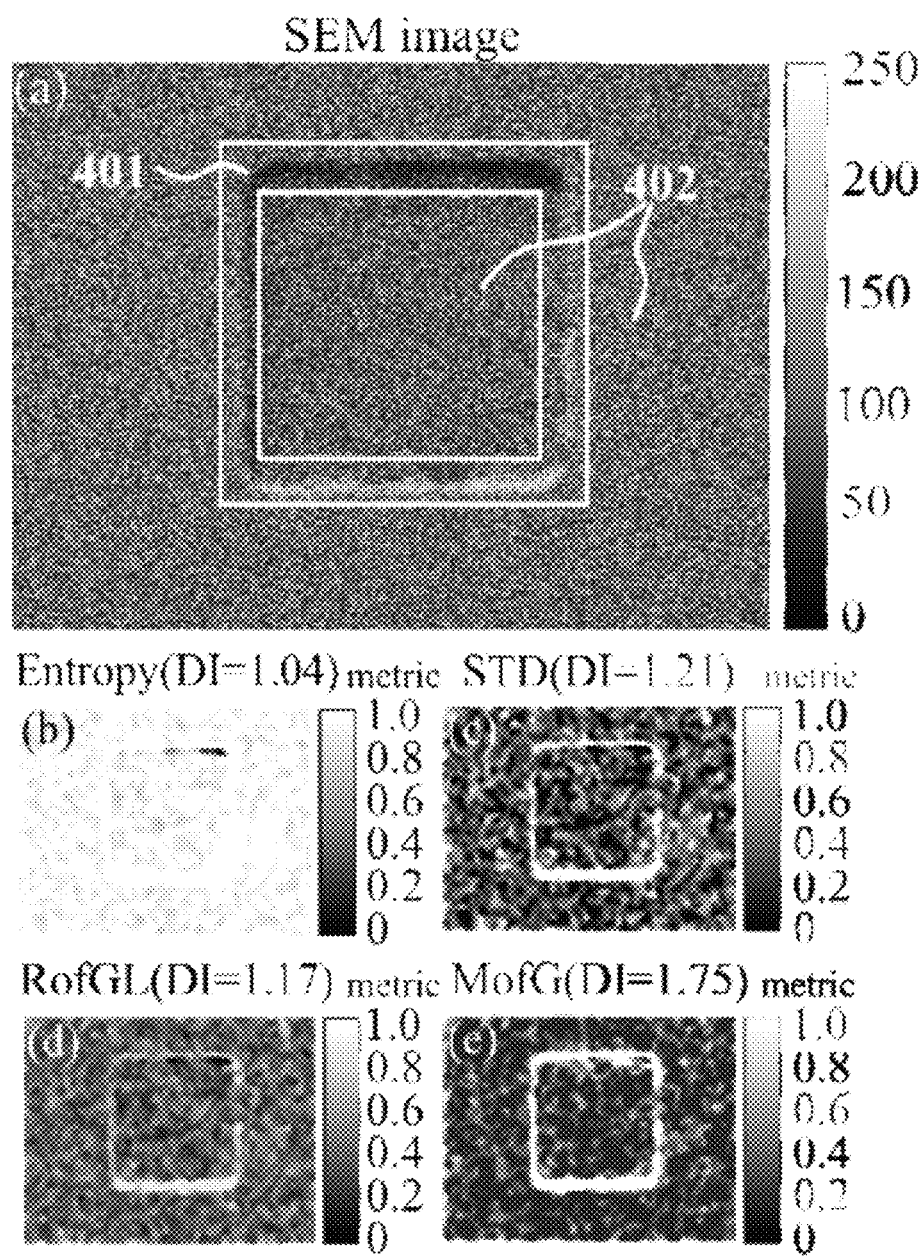
FIG. 4 illustrates feature metric maps generated by using the four algorithms in the first step of FIG. 3.

In this embodiment, a sample with rapid height variations was used to compare the feature metric maps generated from the four different algorithms. FIG. 4 illustrates the results of four feature metric maps, where 401 is the feature-containing area and 402 is the feature-lacking area. In this particular example, MofG provides the best result, as indicated by its highest DI value.

Step 2: Convert Feature Map to Scan Speed Map

The next key step is to convert the feature metric map to a scan speed map via a mapping function. The speed map is a detailed instruction for setting the AFM scan speed at each sampling point and the path of scanning. The mapping principle is to set a higher scan speed in feature-lacking regions that have lower feature metric values, and set a lower scan speed in feature-rich regions that have higher feature metric values.

In one embodiment, the normalized feature metric map is first converted using a gamma function: $v \propto m^\gamma$, $\gamma \geq 0$, where m represents the feature metric value at each sampling location, and v is the AFMs can speed at the corresponding location. $\gamma$ is introduced for achieving a trade-off between AFM scan speed and accuracy. For a region that does not have many features, a higher gamma value increases the local scan speed to save the total scan time. In contrast, for a region rich with features and with rapid changes in feature topography, decreasing gamma makes the AFM scan slower for a finer scan. When gamma is zero, values on the entire scan speed map become a constant number (i.e., a constant scan speed on all sampling points), and the SEM-guided AFM scan method falls back to the traditional slow raster scan.

Due to noise in the SEM image, the computed speed map as is would command the AFM scanner to perform rapid speed changes. This can be difficult to accomplish in practice because it requires high mechanical bandwidths and introduces unwanted vibrations. Thus, a smoothing method such as low-pass filtering and Gaussian filtering is applied to the AFM scan speed map (3022).

Step 3: Send the Speed Map to AFM Controller

The smoothed speed map for guiding the AFM scan is sent from the host computer 104 to the AFM controller 105 through transmission medium 103. The speed map contains detailed information about the movement speed of the AFM XY scanners 204, 205 at each point on the sample. The XY scanning wave generator dynamically adjusts the scan speed for each sampling point on the sample according to the scan speed map. In the feature-lacking/flat region of the sample, the speed map instructs the AFM to scan at a higher speed to save on time. When the AFM approaches a feature with rapid changing topography, the speed map instructs the AFM to decrease the scan rate to capture the fine topography details.

Results

The performance of the present invention can be judged in terms of AFM scan accuracy achieved within a fix amount of scan time. Major measurement distortions in AFM imaging are caused by a phenomenon termed parachuting. During AFM scan, the AFM cantilever tip is closed-loop controlled to keep a certain distance or force between the tip and the sample surface. At a high scan speed, the cantilever height adjustments cannot keep up with the topography change, leading to measurement errors.

Figure 5:
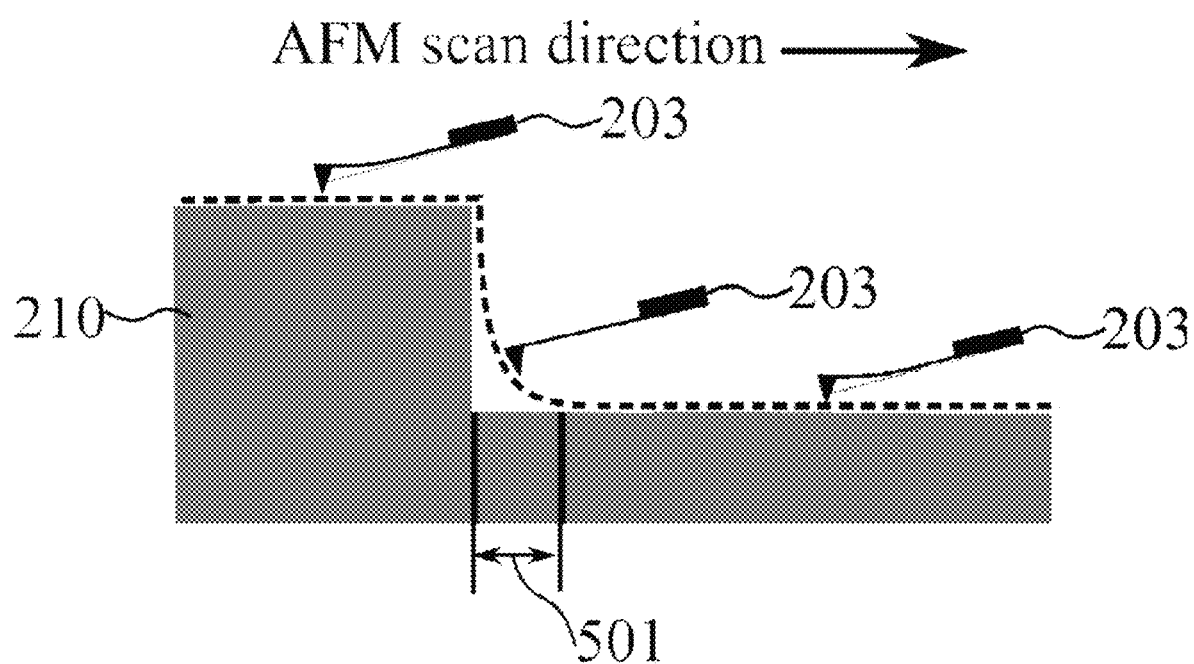
FIG. 5 illustrates the phenomenon of parachuting in AFM scan.

FIG. 5 illustrates parachuting distance that can be used to quantify the AFM imaging accuracy. The parachuting distance 501 of a single line scan over a sharp falling edge is used to determine the scan accuracy. The larger the parachuting distance 501, the worse the AFM scan accuracy. For a whole AFM image, the average parachuting distance can be obtained by averaging all the scan lines in which the parachuting phenomenon occurs. Scan lines without parachuting are not included during averaging. Parachuting distance can be reduced by reducing the scan speed, which in turn increases the total scan time. Traditional AFM scan utilizes a constant scan speed; thus, to reduce parachuting distance, the constant scan speed must be reduced. In contrast, the present invention identifies areas with topography features and dynamically determines the scan speed suitable for each pixel within the image.

In this embodiment, a standard AFM calibration chip VGRPUM from Bruker Nano Inc. was used to demonstrate the methods described in this invention, as well as its effect on AFM scan performance. The chip contains repeating square cavities (5 m in width, 180 nm in cavity depth) fabricated in a silicon wafer.

Figure 6:
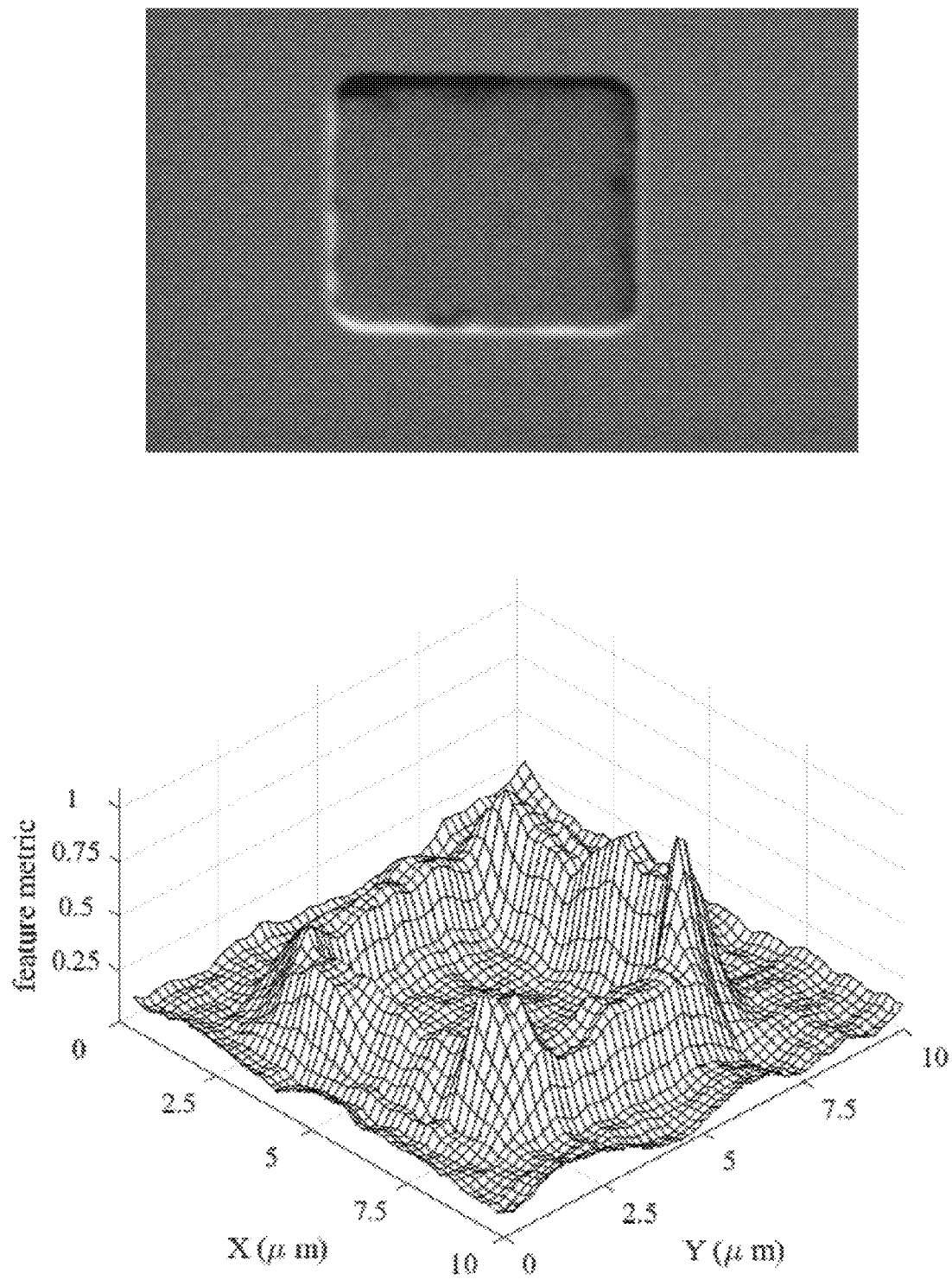
FIG. 6 illustrates an SEM image and the feature metric map extracted from the SEM image.
Figure 7:
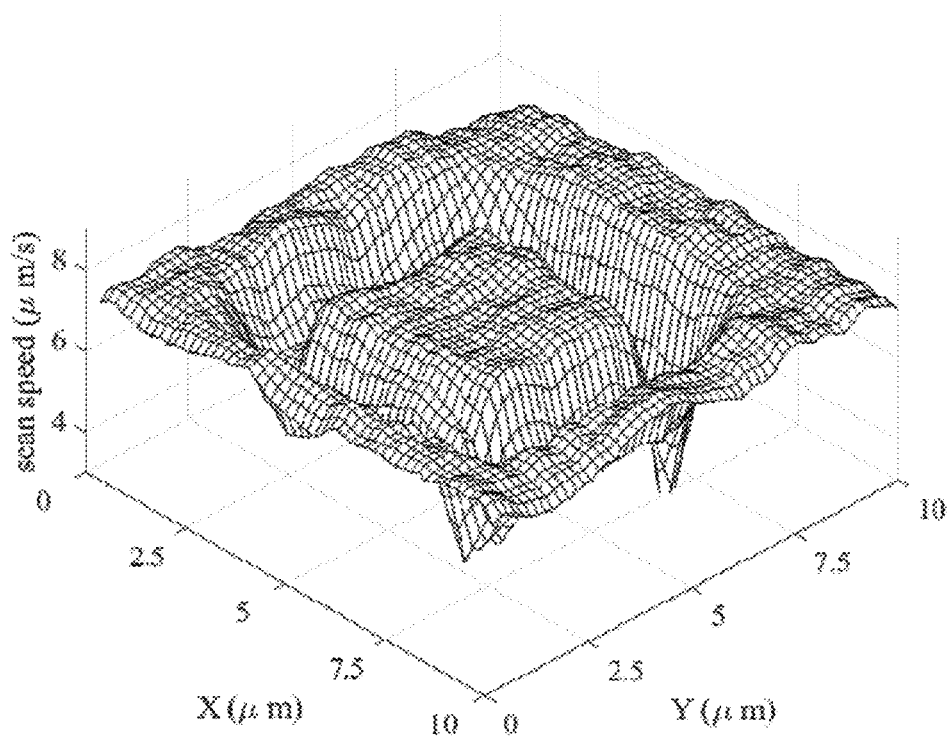
FIG. 7 illustrates the AFM scan speed map converted from the feature metric map shown in FIG. 6.
Figure 8:
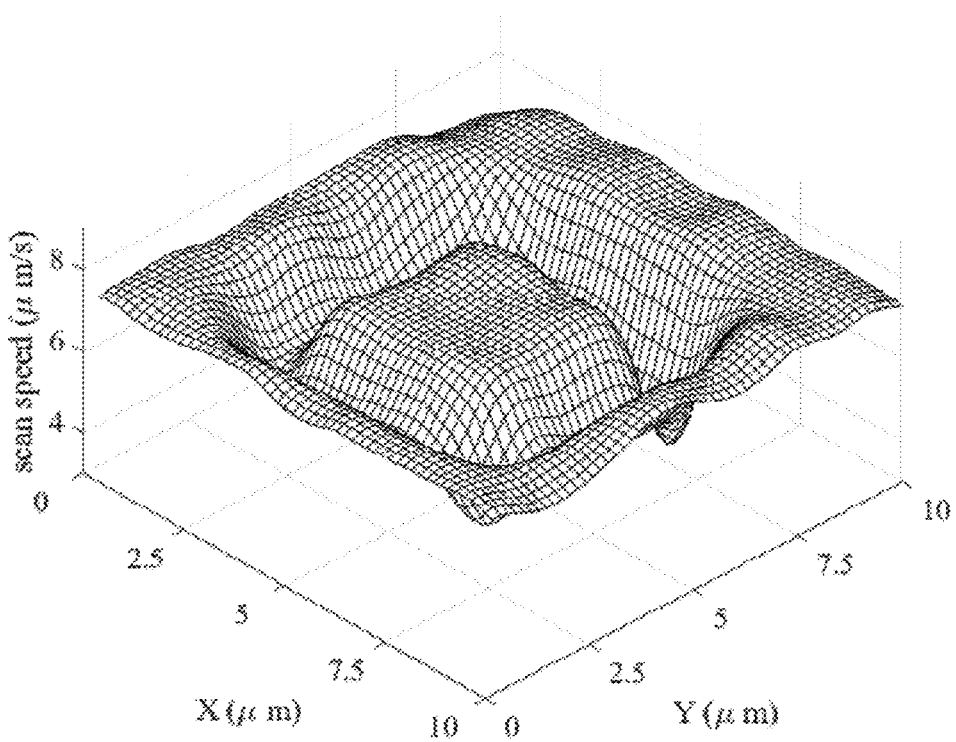
FIG. 8 illustrates the AFM scan speed map, shown in FIG. 7, after the smoothing process.

FIG. 6 illustrates an SEM image of the chip sample and the normalized feature metric map extracted from the SEM image. FIG. 7 shows the speed map converted from the feature metric map. FIG. 8 illustrates the speed map after smoothing.

Shown in FIG. 6 is the feature metric map extracted from the SEM image of a square cavity on the calibration chip. According to the feature metric map, after normalization, the value of the flat region (cavity bottom or the surface of chip) is approximately 0, which means the region contain minimum topography feature. In contrast, rapid changing regions such as the edge of the square have a value close to 1.

Referring to FIG. 7, the speed in the flat region is close to the maximum AFM scan speed, while the speed at the edge of the square is close to the minimum AFM scan speed. This allows time saving while scanning flat region, and maximizes scan accuracy (minimum parachuting) in regions with rapid topography changes. For this experiment, the minimum scan speed at feature-containing area was 2 m/sec and the maximum scan speed in the flat region was 8 m/sec.

FIG. 8 shows the noise-caused rapid scan speed variations are smoothed out. In this embodiment, low-pass filtering was used. It is understood by ones skilled in the art that other smoothing methods can also be used to remove the rapid speed changes.

In order to compare the performance of the method disclosed in the present invention with the traditional AFM scan method, the following experiments were conducted. The sample used was the same AFM calibration chip that contains repeating square patterns. In the first experiment, under a fixed scan time of 2 minutes, scan accuracy was compared between the present invention and traditional AFM scan. The experimental results show that the method of the present invention produced 44% less parachuting distance than the traditional AFM scan method, demonstrating its effectiveness for improving scan accuracy. In the second experiment, using the same sample, the results showed that to achieve a similar level of scan accuracy, the present invention utilized 58% less time than the traditional AFM scan method.

The invention claimed is:

1. A method of varying scan speed of atomic force microscopy (AFM) imaging at each sampling point based on prior topography information extracted from a scanning electron microscopy (SEM) image, comprising:
   (a) A method for producing a feature metric map based on image processing algorithms for identifying and locating topography features from the SEM image;
   (b) A method for converting the feature metric map into an AFM scan speed map;
   (c) A method for setting scan speed for each sampling point, based on the scan speed map, to use a high scan speed for locations on the sample with minimal topography feature, and use a low scan speed for locations on the sample with rich topography features.

2. The method of claim 1, wherein said SEM images are captured using secondary electron imaging mode.

3. The method of claim 1, wherein said algorithms used to generate the feature metric map is based on detecting rapid changing gray scale pixels within the SEM images.

4. The method of claim 3, wherein said algorithm can be local entropy, local standard deviation, local range of gray level, and local magnitude of gradient.

5. The method of claim 1, wherein said feature metric map quantitatively describes the amount of local topography features and distinguishes the feature-containing and feature-lacking regions in SEM images.

6. The method of claim 5, wherein said feature metric map is normalized to allow direct comparison to the feature metric maps generated by other algorithms.

7. The method of claim 6, wherein said feature metric map that best identifies topography features within a given sample is converted to the AFM scan speed map.

8. The method of claim 1, wherein said speed map defines AFM XY scanner speed at each point on the sample.

9. The method of claim 1, wherein said feature metric map is converted into ADA scan speed map through a mathematical transformation.

10. The method of claim 9, wherein said mathematical transformation can be the scan speed map is proportional to the feature metric map to the power of gamma value, wherein the gamma value is a number larger than zero.

11. The method of claim 9, wherein said speed map is filtered to provide smooth speed transitions.

12. The method of claim 11, wherein a filtering method used can be low-pass filtering or Gaussian filtering.

13. A system for atomic force microscopy (AFM) imaging inside a scanning electron microscopy (SEM), comprising:
   (a) An atomic force microscope (AFM) installed inside a scanning electron microscope (SEM);
   (b) A host computer, which extracts topography information from SEM image to generate a speed map for AFM scanning process;
   (c) An AFM controller, which controls scan speed of AFM using the information from the speed map, the AFM controller being connected through wire connection to the host computer;
   (d) An AFM carrier, which scans a sample with dynamically varied speeds based on a control signal from the AFM controller, the AFM carrier being connected through wire connection to the AFM controller.

* * * * *